United States Patent [19]

Hampl, Jr.

[11] 3,852,118

[45] Dec. 3, 1974

[54] THERMOELECTRIC COMPOSITION

[75] Inventor: Edward F. Hampl, Jr., Saint Paul, Minn.

[73] Assignee: Minnesota Mining and Manufacturing Company, St. Paul, Minn.

[22] Filed: Apr. 7, 1972

[21] Appl. No.: 242,219

Related U.S. Application Data

[63] Continuation of Ser. No. 36,145, May 11, 1970, abandoned.

[52] U.S. Cl. ............ 136/238, 136/241, 252/62.3 T, 75/173 C

[51] Int. Cl. ............ H01v 1/18

[58] Field of Search ........... 136/238, 241, 205, 200; 252/69.3 T; 75/153, 173 C

[56] References Cited

UNITED STATES PATENTS

| | | | |
|---|---|---|---|
| 2,232,961 | 2/1941 | Milnes | 136/211 |
| 2,397,756 | 4/1946 | Schwarz | 136/238 |
| 3,095,330 | 6/1963 | Epstein et al. | 136/238 |
| 3,132,488 | 5/1964 | Epstein et al. | 136/241 |
| 3,258,427 | 6/1966 | Rupprecht | 252/62.3 T |

FOREIGN PATENTS OR APPLICATIONS

| | | | |
|---|---|---|---|
| 106,379 | 1/1939 | Australia | 136/238 |

OTHER PUBLICATIONS

Miyatani, "Journal of the Physical Society of Japan," Vol. 15, No. 9, pp. 1586–1595, (1960).

*Primary Examiner*—Harvey E. Behrend
*Attorney, Agent, or Firm*—Alexander, Sell, Steldt & DeLaHunt

[57] ABSTRACT

Thermoelectric generators that include N-type thermoelectric legs cast from alloy compositions that consist essentially of silver, tellurium, and selenium, and, in some embodiments, minor amounts of copper or sulfur.

3 Claims, 1 Drawing Figure

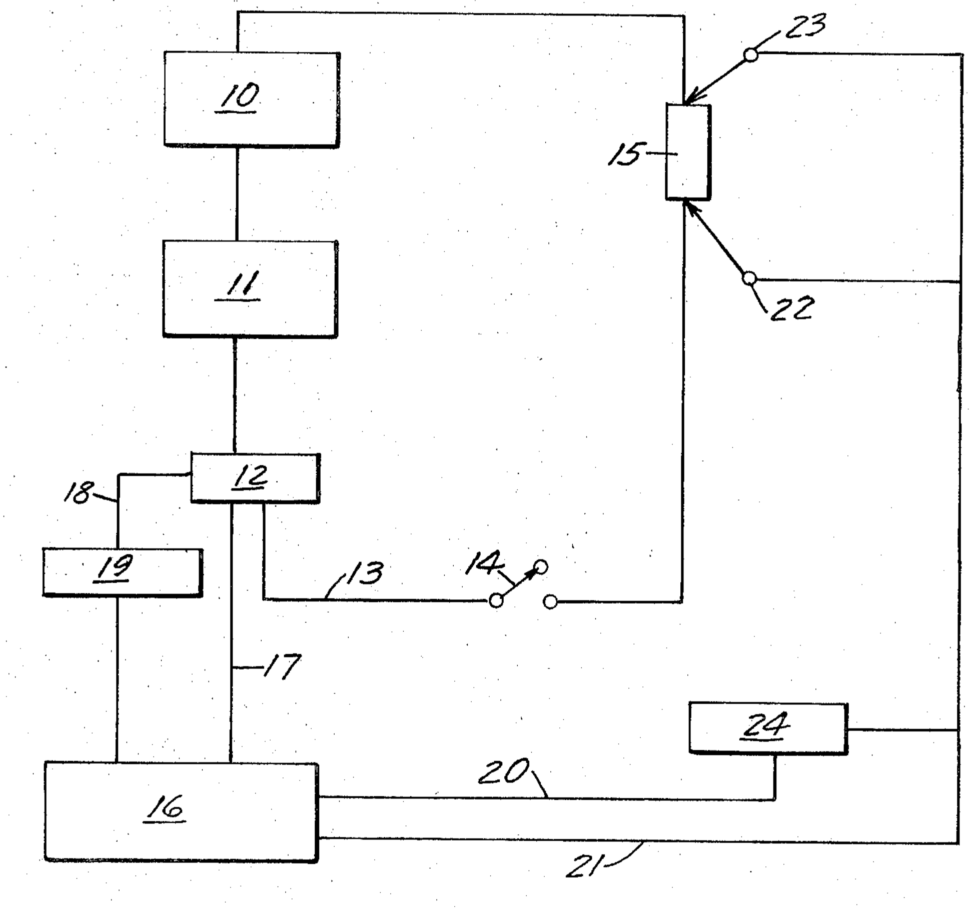
INVENTOR.
EDWARD F. HAMPL, JR.
BY Kinney, Alexander,
Sell, Steldt & De La Hunt
ATTORNEYS

THERMOELECTRIC COMPOSITION

REFERENCE TO RELATED APPLICATION

This application is a continuation of a copending application, Ser. No. 36,145, filed May 11, 1970, and now abandoned. The temperatures at which compositions have useful thermoelectric conversion properties are quite important in evaluating the utility of those compositions for incorporation in thermoelectric generators. For example, it is well known that the thermoelectric conversion efficiency of a thermoelectric generator will improve as the hot ends of the thermoelectric legs in the generator are heated to higher temperatures, assuming the legs retain good thermoelectric properties to those high temperatures. [1]

1. Thermoelectric conversion efficiency (the ratio of electric energy output to thermal energy input for a thermoelectric leg in a thermoelectric generator, for example) is proportional to the Carnot factor ($T_h - T_c/T_h$), as indicated by the following Ioffe expression for thermoelectric conversion efficiency:

$$\text{Efficiency} = (T_h - T_c/T_h)\,[\,\sqrt{1 + Z\,(T_h + T_c)\,/2} - 1\,]/[\,\sqrt{1 + Z\,(T_h + T_c)\,/2} + T_c/T_h],$$

in which $T_h$ and $T_c$ are the absolute temperatures of the hot and cold junctions, respectively; Z is the average value of $\bar{Z}$, the thermoelectric figure of merit, in the temperature interval $T_c$ to $T_h$; and $$Z = [S]^2/[\rho\,K]$$

where S is the Seebeck coefficient, $\rho$ is the electrical resistivity, and K is the thermal conductivity, all of these parameters being functions of temperature.

But the prior-art compositions that have the best basic thermoelectric properties (Seebeck coefficient, electrical resistivity, and thermal conductivity) are generally limited to use below the rather moderate temperatures of 500°–600°C. Above such temperatures, these compositions become intrinsic electrical conductors, whereupon their thermoelectric conversion efficiency is reduced, rather than increased. Further, most of these prior compositions exhibit physical and chemical deterioration at high temperatures--by sublimation, for example--with a resultant loss of properties.

In contrast to the prior-art compositions described above, the alloy compositions used in thermoelectric legs of the present invention remain extrinsic (for example, the electrical resistivity of the compositions increases with increasing temperature in the manner of a metal or semi-metal), and the compositions exhibit thermoelectric properties, over a broad temperature range that extends to temperatures above 800°C. In general, these new alloy compositions consist essentially of constituents selected from silver, copper, tellurium, selenium, and sulfur; the basic ingredients are silver, tellurium, and selenium, with copper or sulfur being added in minor amounts in preferred embodiments. Generally, the silver and copper comprise between about 65.7 and 67.7 atomic percent of the total composition, and the proportions for each of the ingredients is generally as defined by the following table:

| | | | | | | |
|---|---|---|---|---|---|---|
| 60.7 | atomic percent | ≦ | silver | ≦ | 67.7 | atomic percent |
| 0 | atomic percent | ≦ | copper | ≦ | 5 | atomic percent |
| 10 | atomic percent | ≦ | tellurium | ≦ | 30 | atomic percent |
| 3 | atomic percent | ≦ | selenium | ≦ | 24 | atomic percent |
| 0 | atomic percent | ≦ | sulfur | ≦ | 5 | atomic percent. |

These alloy compositions are made by heating the various elements together at a temperature sufficient to cause them to react, whereupon the alloy compositions are in melted, castable form, and the alloy compositions are then cast into thermoelectric legs or sections of thermoelectric legs (as used herein, "thermoelectric leg" means a structural member adapted to extend over the length of a thermal gradient between a heat-input structure and a heat-withdrawal structure in a thermoelectric generator; thermoelectric legs usually are unitary, but may comprise sections, such as sections occupying different lengths of the thermal gradient; usually a whole thermoelectric leg of the invention, but sometimes just a section of the thermoelectric leg, will consist essentially of an alloy composition of the invention). In addition to the above elements, modifying agents that enhance N-type thermoelectric properties may be included in typical modifying amounts, but in the main the electrical transport properties of the composition are modified by excesses over stoichiometry of the ingredients themselves.

While others have previously examined the thermoelectric properties of compositions that include the same elements as the composition used in thermoelectric legs of the invention, no one, to my knowledge, has previously recognized the high utility of the thermoelectric legs of this invention in a thermoelectric generator. One reason for this failure is the fact that the traditional ways of measuring such thermoelectric properties as Seebeck coefficient, resistivity, or thermal conductivity do not accurately reveal the usefulness of compositions used in thermoelectric legs of this invention. Traditional measurements are usually made under open-circuit conditions, so that a current is not flowing through the composition tested. Also, traditional measurements are often isothermal measurements in which the whole material measured is subjected to the same fixed temperature.

But it has been found that the thermoelectric conversion properties of compositions of the invention are significantly improved when subjected to the combined influence of thermal and electrical gradients, and that, of course, is the condition the compositions operate under when they are in actual use in the thermoelectric generation of electric power. This improvement in conversion properties occurs because of a movement of atoms or ions through the compositions when they are embodied as a thermoelectric leg located in thermal and electrical gradients. This movement causes a redistribution of current carriers along the length of the leg—from a high amount at the hot end to a lower amount at the cold end—that is ideal for thermoelectric conversions.

The described movement of atoms or ions arises from the fact that the compositions are "mixed-valence" "defect-doped" alloy compositions exhibiting a high ionic mobility. "Mixed-valence" compositions are compositions in which at least one of the ingredient elements is capable of existing in the composition in two valence states. "Defect-doped" compositions are compositions in which current carriers are provided by the natural formation of a non-stoichiometric lattice structure that includes a small-percentage excess or deficiency of one kind of the atoms of the composition. In the case of these N-type compositions, metal atoms are in excess of stoichiometry (stoichiometry would require that two-thirds of the atoms in the composition be metal atoms). The result is that an excess of electrons, which are the dopant or current carrier in N-type compositions, develops in direct proportion to the amount of the excess of metal atoms.

It has been discovered that the excess metal atoms, which carry ionic charges, move in the composition under the influence of thermal and electrical gradients until a steady-state condition is reached in which the atoms or ions are distributed in an infinitely graded series of different concentrations throughout the length of the gradient. More specifically, when an N-type thermoelectric leg of this invention is in a thermoelectric generator operating under load, so that the leg is in both thermal and electrical gradients, the metal atoms or ions in the leg move toward the hot end of the leg, thereby increasing the number of electrons—that is, the dopant—at that end of the leg. Over the length of the leg there is a gradation of doping levels, varying infinitely from the large number at the hot end to a lower number at the cold end. This gradation improves thermoelectric conversion efficiency, since, as is well known, to achieve optimum thermoelectric conversion efficiency, the doping level in a thermoelectric material should vary from a high level of current carriers at the hot end of the gradient to a lower level of current carriers at the cold end.

An example of the prior art providing a background for this invention is U.S. Pat. No. 3,095,330. That patent teaches a method for making thermoelectric legs by first reacting elemental ingredients in ionic form in a solution, then precipitating the reacted compound out of the solution as a powder, then compressing the powder into a unified product, and then heat-treating or sintering the unified product. The patent refers to a wide variety of ingredients for use in products of the patent, but in one specific example the patent lists a product apparently made by first obtaining in powder form the compounds silver telluride and silver selenide, mixing these powders in a mole ratio of 75 to 25, then pressing the mixed powders into a unified sample, and then heating the unified sample at about 100°C for 15 minutes.

U.S. Pat. No. 3,095,330 states that the powder-pressed products described in the patent differ radically from cast products, and alleges that superior results are achieved by the powder-pressed products. But the patent admits that such superior results contradict known principles of thermoelectricity, such as the fact that electrical resistivity is generally increased by using powder-pressing techniques (column 4, lines 20–23 of the patent), and the Wiedmann-Franz rule (column 6, lines 23–26).

In contrast to the teachings of U.S. Pat. No. 3,095,330, it has been found that thermoelectric legs of this invention obtained by heating the ingredients to a molten form (in which they can be poured into a mold and cast) and then casting the alloy composition offer advantageous thermoelectric properties not known to be available in any other material. Thermoelectric legs of the invention are especially adapted for use in thermoelectric generators with P-type thermoelectric legs as taught in my copending application, Ser. No. 635,948, made from copper-silver-tellurium or copper-silver-selenium compositions. Thermocouples of such P-type legs and N-type legs of this invention may be used to high temperatures, offer few compatibility problems, are mechanically and chemically reliable, and perform at greater efficiency than available from any other known thermoelectric couples.

As previously noted, compositions of the invention are defect-doped; that is, current carriers are provided in the composition by excesses over stoichiometry of the elements themselves. That fact is illustrated by the following table, which shows the changes in Seebeck coefficient and resistivity that occur at the ratio of chalcogen to metal is varied. Data on four different compositions of silver, tellurium, and selenium are provided, with the proportions of the compositions given in the table; as will be noted, the A and D compositions are not included within this invention:

| | Proportions Ag (at %) | Te (at %) | Se (at %) | Atomic Ratio [Te + Se]:[Ag] | Seebeck Coefficient at 45°C (μV/°C) | Resistivity (mΩ– cm) |
|---|---|---|---|---|---|---|
| A | 65.35 | 18.41 | 16.24 | 0.531 | 340 | 420 |
| B | 66.2 | 20.3 | 13.5 | 0.511 | 170 | 2.4 |
| C | 66.67 | 16.67 | 16.67 | 0.500 | 125 | 1.4 |
| D | 67.87 | 18.55 | 13.58 | 0.474 | weak N-type | 1.2 |

The properties for two additional sample compositions of the invention are given in the following table. The Seebeck coefficient values are given both as determined by open-circuit measurements and by the more accurate closed-circuit measurements (the method for making both the open-circuit and closed-circuit measurements is described at the end of the specification). The A composition tested included 66.67 atomic percent silver, 25.00 atomic percent tellurium, and 8.33 atomic percent selenium; and the B composition included 66.67 atomic percent silver, 20.00 atomic percent tellurium, and 13.33 atomic percent selenium. The properties were measured at two different thermal gradients, with the temperatures of the hot and cold ends ($T_h$ and $T_c$, respectively) given in the table.

| Composition | Temperature interval, $T_h/T_c$ (° C.) | Average seebeck coefficient (relative to platinum) Open-circuit (μv./° C.) | Closed-circuit (μv./° C.) | Average resistivity (m.Ω-cm.) | Average thermal conductivity* (m.ω/cm.° C.) | Average figure of merit (relative to platinum) Open-circuit ($10^{-3}$/° C.) | Closed-circuit ($10^{-3}$/° C.) | Average figure of merit (relative to absolute) Open-circuit ($10^{-3}$/° C.) | Closed-circuit ($10^{-3}$/° C.) |
|---|---|---|---|---|---|---|---|---|---|
| A | 413/164 | 76.7 | 83.6 | 0.81 | 14.0 | 0.519 | 0.616 | 0.672 | 0.773 |
| A | 642/172 | 84.5 | 91.6 | 1.1 | 14.0 | 0.464 | 0.545 | 0.617 | 0.710 |
| B | 405/152 | 86.9 | 99.0 | 0.79 | 17.0 | 0.562 | 0.730 | 0.700 | 0.885 |
| B | 615/172 | 95.7 | 99.3 | 0.98 | 17.0 | 0.550 | 0.592 | 0.708 | 0.760 |

* Average value for the temperature interval 400° C./150° C.

As reported, compositions of the invention have low thermal conductivities, due especially to a low lattice-component of thermal conductivity. Because of their low thermal conductivities, the compositions have high figures of merit into high-temperature regions and, as indicated by the Ioffe efficiency expression set out above, correspondingly high conversion efficiencies. Within the broad range stated above for the ingredients, there are compositions that are preferred because they have the highest figure of merit. These compositions include metal in about the same proportions as stated above, but lie in a range around a composition in which tellurium and selenium are in an approximate ratio of 60 to 40.

Further, as previously noted, minor amounts (up to 5 atomic percent) of copper or sulfur or both are added to compositions of the invention to beneficially increase the magnitude of the Seebeck coefficient (and electrical resistivity) without causing the material to become intrinsic at higher temperatures. Preferred compositions of the invention include minor amounts of copper (at least 0.1 atomic percent and preferably about 0.6 atomic percent or more), with the most preferred compositions including less than about 2 atomic percent copper. For example, an addition of about 0.6 atomic percent copper can increase the Seebeck coefficient and resistivity by 25 percent or more, with a corresponding increase in power number and figure of merit. The thermal conductivity remains low after addition of either copper or sulfur.

The alloy compositions from which thermoelectric legs of this invention are fabricated are typically prepared by first mixing the ingredient elements in finely divided form (preferably less than 20-mesh, U.S. Standard screen size); the ingredients should each contain less than 0.01 percent by weight impurity. The mixture is then melted in an oxygen-free or reducing atmosphere of preferably carbon monoxide or alternatively hydrogen, nitrogen, or argon to prevent the ingredients from oxidizing; and the reaction system is sealed to prevent loss of tellurium or selenium which vaporize readily. As the mixture is heated, a low-temperature reaction occurs first, at a temperature slightly above the melting point of the chalocogen, with the liquid tellurium, selenium, or sulfur reacting with the still-solid silver or copper. This low-temperature reaction is desirable since it lowers the vapor pressure of the chalcogen and diminishes the possibility of a violent reaction when the temperature is subsequently increased to melt the silver and copper. The length of time required to complete the low-temperature reaction varies with the size of the charge: when the charge is in 25-gram sizes, the time for reaction is typically about 1 to 3 hours; when the charge is in 500-gram sizes, the time for reaction is typically about 12 hours. After the low-temperature reaction, the material is gradually heated to higher temperatures until the whole mixture is molten. The mixture is maintained in a molten condition, desirably with some agitation, until complete reaction of the elements has occurred. Again, the time varies with the size of the charge, and also varies with the melting points of the compositions and ingredients. For 25-gram-sizes, the time for the complete reaction is typically 12 hours, while for 500-gram-sizes, the time is typically 50 hours.

The reacted mixture is cooled to room temperature before the reaction vessel is unsealed. The ingot is ground to a powder, melted, and cast to a desired geometry under a reducing atmosphere in a sealed vessel. Hydrogen is preferably not used as the reducing atmosphere when casting the final product because of its high solubility in the liquid melt, which results in porous castings and formation of hydrids. The freezing of the melt in the mold should be accomplished under a partial vacuum, such as a vacuum in which the pressure is about 1 inch mercury, to suppress the unusually high gas solubility in the liquid melt.

After the alloy composition has been placed in the mold and solidified, further cooling can be carried out under pressure in an atmosphere of a heavy gas such as argon or carbon dioxide to insure a more uniform rate of cooling of the ingot. The alloy should be allowed to cool at a slow rate in a furnace, rather than by a quenching operation, to prevent the formation of stresses in the ingot. A desired cooling rate is one of approximately a few degrees centigrade per minute. The melting and casting can be carried out in crucibles of such inert materials as carbon, alumina, pre-fired lavite, and quartz.

After casting, the ingot is machined to the desired dimensions, if that is necessary, and then should be annealed to relieve stresses and make the composition of the thermocouple leg more homogeneous. The annealing may be carried out in a sealed quartz tube under an atmosphere of hydrogen. Temperatures of 650°–800°C for 12 hours or more are preferred. The resulting elements are quite strong, and have a room-temperature Knoop hardness number of 60 to 80 depending on the composition. For comparison, lead telluride has a Knoop hardness number of 25 at room temperature.

A complete thermocouple is formed by joining an N-type thermoelectric leg of this invention to a P-type thermoelectric leg through electrode members and other interconnecting members as known in the art. As previously noted, an especially useful combination is N-type legs of this invention with legs of the P-type copper-silver-tellurium or copper-silver-selenium compositions taught in my copending patent application, Ser. No. 635,948. To obtain the highest efficiency, the thermocouples are heated to high temperatures; preferably the hot-junction of the thermocouples are heated to at least 650°C.

In forming a thermocouple, the thermoelectric legs of this invention may be joined to an electrode member at the cold junction by either a metallurgical bond or a pressure contact. The electrode member is typically a metal such as copper, nickel, or any other good metallic electrical and thermal conductor. At the hot junction the best connection is made by contacting an electrode member preferably of silver, but alternatively of tungsten, tungsten-rhenium alloy, oxide-free molybdenum, molybdenum-iron alloy, iron, nickel, graphite, or platinum.

A typical test circuit for making both open- and closed-circuit measurements is shown in the drawings. The circuit includes a direct-current power supply 10, alternating-current power supply 11, and a shunt 12 of known resistance. The major portion of current travels from the shunt 12 through the circuit branch 13, which includes a switch 14 and the thermoelectric leg 15 being tested, and then returns to the direct-current power supply 10. Voltage-drops in the shunt proportional to the alternating and direct currents are read by direct-current recording meters 16 through lines 17 and 18. The line 18 includes a convertor 19 that converts the alternating-current signal coming from the shunt 12 to a direct-current signal. The recording meters 16 only read the direct-current portion of the combined alternating-current and direct-current signal in the line 17. The recording meters 16 are connected through lines 20 and 21 to probes 22 and 23 that are placed against the thermoelectric leg being tested; the line 20 includes a convertor 24 that converts alternating-current readings from the probes to direct-current readings. The probes 22 and 23 measure the temperature and the direct-current and alternating-current potentials at the hot and cold junctions, respectively.

Traditional open-circuit measurements are generally made without the alternating-current power supply 11 and are made by simply opening the switch 14 to open the circuit. The open-circuit voltage ($E_{oc}$) and the temperature interval are then measured, and the Seebeck coefficient calculated from those measurements. As noted above, with the switch 14 open, there is substantially no current flowing through the thermoelectric leg, with the result that the current carriers are not redistributed in the manner described above.

In the closed-circuit measurement, the switch 14 remains closed so that both an alternating current ($I_{ac}$) and a direct current ($I_{dc}$) are flowing through the thermoelectric leg 15. The alternating-current and direct-current voltages ($E_{ac}$ and $E_{cc}$), and the alternating current and direct current are then measured, whereupon Seebeck coefficient is calculated as follows:

$$R = (E_{ac}/I_{ac})$$

$$E_{oc} = (R)\ (I_{dc})\ E_{cc}$$

$$S = [I_{dc}\ d(E_{ac})/I_{ac}\ d(T)] + [d\ (E_{cc})/d(T)]$$

What is claimed is:

1. In a thermoelectric generator, an N-type thermoelectric leg, at least a section of which consists essentially of a cast alloy composition of at least four ingredients reacted together while in melted castable form and selected from the group consisting of silver, copper, tellurium, selenium, and sulfur in proportions, such that the total of silver and copper is in excess of 66⅔ atomic percent and less than 67.7 atomic percent of the composition, with copper being present in an amount between 0.1 and 5 atomic percent of the composition; sulfur is present in an amount between 0 and 5 atomic percent of the composition; and the balance of the composition is tellurium and selenium in proportions such that the ratio of the atomic percent of tellurium in the composition to the atomic percent of selenium is about 60:40.

2. A thermoelectric generator of claim 1 in which copper is included in the alloy composition in an amount between about 0.6 and 2 atomic percent.

3. In a thermoelectric generator of claim 1, a P-type thermoelectric leg, at least a section of which consists essentially of either copper, silver, and tellurium or copper, silver, and selenium.

* * * * *